(12) United States Patent
Seo

(10) Patent No.: US 10,747,038 B2
(45) Date of Patent: Aug. 18, 2020

(54) DISPLAY DEVICE

(71) Applicant: SAMSUNG DISPLAY CO., LTD., Yongin-si, Gyeonggi-do (KR)

(72) Inventor: Hae-Kwan Seo, Hwaseon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 541 days.

(21) Appl. No.: 15/146,731

(22) Filed: May 4, 2016

(65) Prior Publication Data
US 2016/0351586 A1 Dec. 1, 2016

(30) Foreign Application Priority Data

May 28, 2015 (KR) .................. 10-2015-0075098

(51) Int. Cl.
*G02F 1/1333* (2006.01)
*H01L 23/00* (2006.01)
(Continued)

(52) U.S. Cl.
CPC .... *G02F 1/133345* (2013.01); *G02F 1/13452* (2013.01); *H01L 24/17* (2013.01); *H01L 24/50* (2013.01); *H01L 24/73* (2013.01); *G09G 3/3225* (2013.01); *G09G 3/3648* (2013.01); *G09G 2300/0426* (2013.01); *H01L 24/13* (2013.01); *H01L 24/14* (2013.01); *H01L 24/16* (2013.01); *H01L 24/29* (2013.01); *H01L 24/32* (2013.01); *H01L 24/48* (2013.01); *H01L 2224/133* (2013.01); *H01L 2224/1319* (2013.01); *H01L 2224/13025* (2013.01); *H01L 2224/1329* (2013.01); *H01L 2224/13116* (2013.01); *H01L 2224/13144* (2013.01); *H01L 2224/13147* (2013.01); *H01L 2224/14181* (2013.01); *H01L 2224/16227* (2013.01);
(Continued)

(58) Field of Classification Search
CPC . H01L 27/124; H01L 23/49833; H01L 24/17; H01L 24/50; H01L 24/73; H01L 2224/17181; H01L 24/16; H01L 2224/32105; H01L 24/29; H01L 24/32; H01L 24/48; H01L 2924/151; H01L 2224/4813; G02F 1/1333
USPC ......................................................... 257/72
See application file for complete search history.

(56) References Cited

U.S. PATENT DOCUMENTS

| | | | | |
|---|---|---|---|---|
| 6,697,041 B1* | 2/2004 | Tamai | .................. | G09G 3/3688 345/100 |
| 7,119,801 B1* | 10/2006 | Endo | .................... | G02F 1/13452 345/204 |
| 2005/0121796 A1* | 6/2005 | Park | .................. | H01L 23/49838 257/773 |
| 2007/0013857 A1* | 1/2007 | Chung | ................ | G02F 1/13452 349/152 |
| 2008/0055291 A1* | 3/2008 | Hwang | .................. | H05K 3/361 345/204 |

(Continued)

FOREIGN PATENT DOCUMENTS

| | | |
|---|---|---|
| KR | 10-2007-0006327 A | 1/2007 |
| KR | 10-1364088 B1 | 2/2014 |
| KR | 10-2014-0106706 A | 9/2014 |

*Primary Examiner* — Shaun M Campbell
(74) *Attorney, Agent, or Firm* — Lewis Roca Rothgerber Christie LLP

(57) ABSTRACT

A display device includes: a display panel; a driver integrated circuit (IC) including a first surface electrically connected to the display panel and a second surface opposing the first surface and electrically connected to the first surface; and a connecting structure including a first side portion electrically connected to the second surface of the driver IC, and a second side portion electrically connected to an external device.

11 Claims, 7 Drawing Sheets

(51) Int. Cl.
*G02F 1/1345* (2006.01)
*G09G 3/3225* (2016.01)
*G09G 3/36* (2006.01)

(52) U.S. Cl.
CPC ............ *H01L 2224/17181* (2013.01); *H01L 2224/2919* (2013.01); *H01L 2224/32058* (2013.01); *H01L 2224/32105* (2013.01); *H01L 2224/32106* (2013.01); *H01L 2224/4813* (2013.01); *H01L 2224/50* (2013.01); *H01L 2224/73204* (2013.01); *H01L 2224/73253* (2013.01); *H01L 2224/73261* (2013.01); *H01L 2224/81444* (2013.01); *H01L 2924/00014* (2013.01); *H01L 2924/151* (2013.01)

(56) References Cited

U.S. PATENT DOCUMENTS

| | | | |
|---|---|---|---|
| 2011/0018129 A1* | 1/2011 | Suzuki | G02F 1/13452 |
| | | | 257/737 |
| 2014/0077063 A1* | 3/2014 | Cho | H01L 27/14618 |
| | | | 250/208.1 |
| 2016/0128194 A1* | 5/2016 | Hong | H05K 1/147 |
| | | | 361/749 |
| 2016/0188059 A1* | 6/2016 | Lee | G06F 3/0416 |
| | | | 345/173 |
| 2016/0232838 A1* | 8/2016 | Seo | G09G 3/20 |
| 2016/0300548 A1* | 10/2016 | Seo | H01L 24/13 |
| 2017/0069706 A1* | 3/2017 | Yoon | H01L 27/3279 |
| 2017/0170164 A1* | 6/2017 | Yip | H01L 23/373 |
| 2017/0295649 A1* | 10/2017 | Zhang | G09F 9/30 |

* cited by examiner

DISPLAY DEVICE

CROSS-REFERENCE TO RELATED APPLICATION

This application claims priority to, and the benefit of, Korean Patent Application No. 10-2015-0075098, filed on May 28, 2015 in the Korean Intellectual Property Office (KIPO), the entire disclosure of which is incorporated by reference herein.

BACKGROUND

1. Field

One or more aspects of example embodiments relate to display devices. More particularly, one or more aspects of example embodiments relate to display devices including driver integrated circuits (ICs) and connecting structures.

2. Description of the Related Art

In a display device, a driver integrated circuit (IC) may be mounted on a display panel by a chip-on-glass (COG) process, a tape carrier package (TCP) process, or a chip-on-film (COF) process. The COG process is relatively simple compared to the TCP or COF processes, and may increase a ratio of a display area on the display panel to a non-display area.

A data transfer rate to the display panel has increased in accordance with a development of high-resolution display devices. Technologies that enhance the data transfer rate on a printed circuit board and on a flexible printed circuit have been developed. Also, more wires may be located on a smaller area in accordance with a gradual development of IC manufacturing processes.

However, the data transfer rate of wires on the display panel may be limited by a physical limitation of the wires on the display panel. Also, narrowing a width of each pad on the display panel may be more difficult than narrowing a width of each terminal of the driver IC.

The above information disclosed in this Background section is only for enhancement of understanding of the background of the invention, and therefore, may contain information that does not constitute prior art.

SUMMARY

One or more example embodiments provide a display device capable of directly transferring input signals to a driver integrated circuit (IC) without wires on a display panel.

One or more example embodiments provide a display device capable of transferring output signals from one driver IC to a plurality of pad parts.

According to an example embodiment, a display device includes: a display panel; a driver integrated circuit (IC) including: a first surface electrically connected to the display panel; and a second surface opposing the first surface and electrically connected to the first surface; and a connecting structure including: a first side portion electrically connected to the second surface of the driver IC; and a second side portion electrically connected to an external device.

In an example embodiment, the first surface and the second surface may be electrically connected to each other through at least one through-silicon-via.

In an example embodiment, the connecting structure may include: a base film; a conducting pattern on a surface of the base film; and an insulating layer on the conducting pattern.

In an example embodiment, the driver IC may further include: output bumps on the first surface; and input bumps on the second surface.

In an example embodiment, the output bumps may be uniformly arranged on an entirety of the first surface.

In an example embodiment, the input bumps may be uniformly arranged on an entirety of the second surface.

In an example embodiment, the input bumps and the output bumps may include gold (Au), lead (Pb), copper (Cu), a conductive resin, or a metal-resin composite material.

In an example embodiment, the first side portion of the connecting structure may entirely cover the second surface of the driver IC.

In an example embodiment, the first side portion of the connecting structure may partially cover the second surface of the driver IC.

In an example embodiment, the driver IC may include a data driver IC and/or a scan driver IC.

In an example embodiment, the display device may further include a sealing member surrounding the first side portion of the connecting structure and the second surface of the driver IC.

According to an example embodiment, a display device includes: a display panel including a first pad part and a second pad part; a driver integrated circuit (IC) including a first surface electrically connected to the first pad part, and a second surface opposite the first surface, the first surface and the second surface being electrically connected to each other; and a connecting structure including a first area electrically connected to the second surface of the driver IC, and a second area electrically connected to the second pad part.

In an example embodiment, the driver IC may further include first output bumps on the first surface, and second output bumps on the second surface, and the connecting structure may further include connecting bumps on the second area.

In an example embodiment, the second pad part may be on a left side or a right side of the first pad part.

In an example embodiment, the display panel may further include a third pad part, and the connecting structure may further include a third area electrically connected to the third pad part.

In an example embodiment, the driver IC may further include first output bumps on the first surface, second output bumps on the second surface, and third output bumps on the second surface, and the connecting structure may further include first connecting bumps on the second area, and second connecting bumps on the third area. In an example embodiment, the second pad part may be on one of a left side and a right side of the first pad part, and the third pad part may be on another one of the left side and the right side of the first pad part.

In the display device according to one or more example embodiments, because input signals are directly transferred to the driver IC through the connecting structure without passing through wires on the display panel, a transfer rate of the input signals may increase. Moreover, because both surfaces of the driver IC are available to be used, the number of input and/or output signals may increase. Therefore, the number of the input and/or output signals of the display device may increase, and the display device may be rapidly driven.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
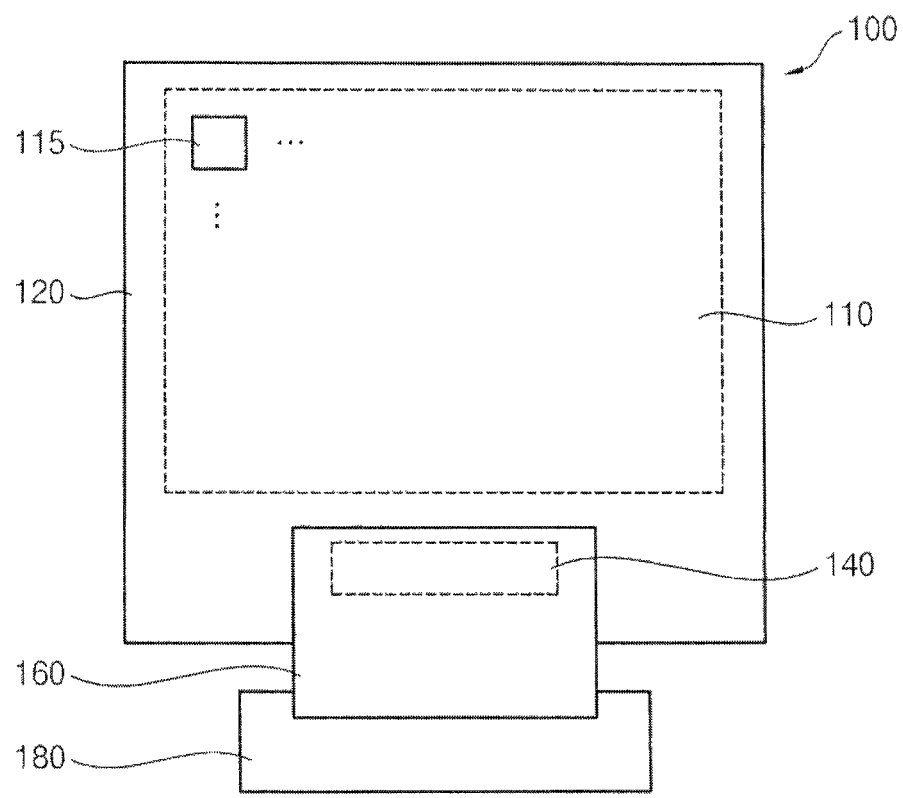
FIG. 1 is a plan view illustrating a display device in accordance with example embodiments.

Hereinafter, example embodiments will be described in more detail with reference to the accompanying drawings. The present inventive concept, however, may be embodied in various different forms, and should not be construed as being limited to only the illustrated embodiments herein. Rather, these embodiments are provided as examples so that this disclosure will be thorough and complete, and will fully convey the aspects and features of the inventive concept to those skilled in the art. Accordingly, processes, elements, and techniques that are not necessary to those having ordinary skill in the art for a complete understanding of the aspects and features of the inventive concept may not be described. Unless otherwise noted, like reference numerals denote like elements throughout the attached drawings and the written description, and thus, descriptions thereof may not be repeated.

In the drawings, the relative sizes of elements, layers, and regions may be exaggerated for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the inventive concept.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the inventive concept. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and/or any other relevant devices or components according to embodiments of the inventive concept described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the inventive concept.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
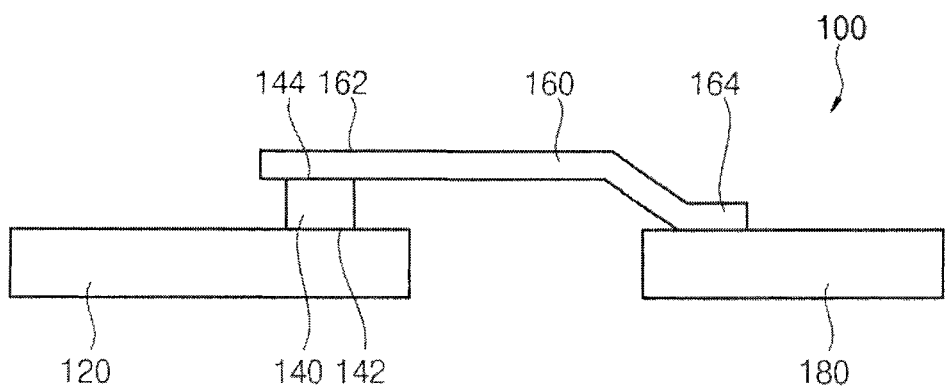
FIG. 2 is a side view illustrating a display device in accordance with example embodiments.

FIG. 1 is a plan view illustrating a display device in accordance with example embodiments, and FIG. 2 is a side view illustrating a display device in accordance with example embodiments.

Referring to FIGS. 1 and 2, the display device 100 may include a display panel 120, a driver integrated circuit (IC) 140, and a connecting structure 160. An external device 180 may be connected to the display device 100.

The display panel 120 may include a display area 110 on which a plurality of pixels 115 are located, and a peripheral area to which the driver IC 140 may be electrically connected. For example, the plurality of pixels 115 may be arranged in a matrix form on the display area 110. The plurality of pixels 115 may display an image based on output signals transferred from the driver IC 140. The display panel 120 may include an organic light emitting display (OLED) panel or a liquid crystal display (LCD) panel, depending on a type of the display device 100.

The driver IC 140 may receive input signals from the connecting structure 160, and may transfer the output signals to the plurality of pixels 115 on the display area 110 of the display panel 120. For example, the input signals and/or the output signals may include a power voltage signal, an initialization voltage signal, a data voltage signal, and a scan voltage signal. In some embodiments, the driver IC 140 may be a data driver IC that supplies the data voltage signal to the display area 110, and/or a scan driver IC that supplies the scan voltage signal to the display area 110. In some embodiments, the driver IC 140 may be an integrated driver IC that includes the data driver IC and the scan driver IC.

A first surface 142 of the driver IC 140 may be electrically connected to the peripheral area of the display panel 120. For example, the first surface 142 may be a bottom surface of the driver IC 140. In some embodiments, the driver IC 140 may be electrically connected to the display panel 120 by a chip-on-glass (COG) manner. Although one driver IC 140 is electrically connected to the display panel 120 in FIG. 1, a plurality of the driver ICs 140 may be electrically connected to the display panel 120 in some embodiments.

The connecting structure 160 may receive signals from the external device 180, and may transfer the signals to the driver IC 140.

A first side portion 162 of the connecting structure 160 may be electrically connected to a second surface 144 of the driver IC 140 that faces away from (e.g., opposes) the first surface 142 of the driver IC 140. For example, the first side portion 162 may be one of side portions of the connecting structure 160, and the second surface 144 may be a top surface of the driver IC 140. In some embodiments, the connecting structure 160 may be electrically connected to the driver IC 140 by a chip-on-film (COF) manner.

In some example embodiments, the first side portion 162 of the connecting structure 160 may entirely cover the second surface 144 of the driver IC 140. Thus, a contact area between the driver IC 140 and the connecting structure 160 may be substantially increased, and the second surface 144 of the driver IC 140 may be substantially fully utilized for a connection between the display panel 120 and the connecting structure 160. Therefore, the number of signals transferred to the display panel 120 through the driver IC 140 may be increased.

The external device 180 may transfer signals to the connecting structure 160. For example, the external device 180 may be a flexible printed circuit (FPC) or a printed circuit board (PCB). In some embodiments, the external device 180 may include a timing controller to control the signals transferred to the driver IC 140.

A second side portion 164 of the connecting structure 160 may be electrically connected to the external device 180. For example, the second side portion 164 may be an opposite side to the first side portion 162 of the connecting structure 160.

Figure 3:
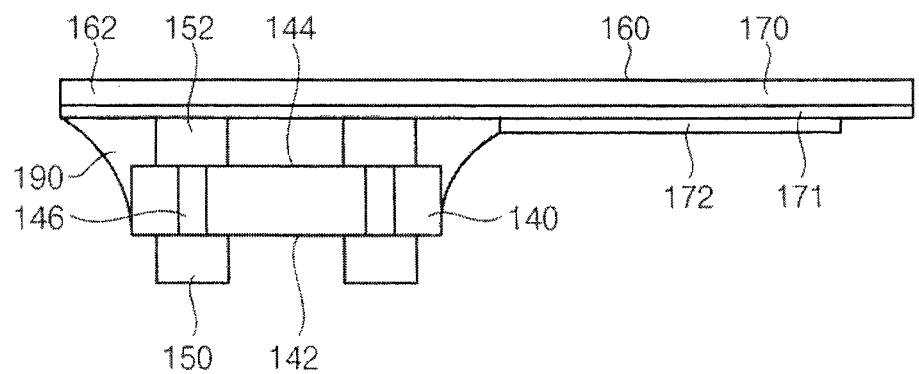
FIG. 3 is a cross-sectional view illustrating a display device in accordance with example embodiments.

FIG. 3 is a cross-sectional view illustrating a display device in accordance with example embodiments.

Referring to FIGS. 1 to 3, the display device 100 may include the display panel 120, the driver IC 140, and the connecting structure 160.

In some example embodiments, the first surface 142 and the second surface 144 of the driver IC 140 may be electrically connected to each other. For example, the first surface 142 and the second surface 144 of the driver IC 140 may be connected to each other in a direct manner (e.g. may be connected to each other by a wire bonding or a flip-chip bonding) or in an indirect manner (e.g. a manner using an electric field or a magnetic field). The number of surfaces of the driver IC 140 to be used for a connection between the display panel 120 and the external device 180 may increase, and the number of input and output signals may increase, as the first surface 142 and the second surface 144 of the driver IC 140 are electrically connected to each other.

In some embodiments, the first surface 142 of the driver IC 140 may be electrically connected to the second surface 144 of the driver IC 140 through at least one through-silicon-via (TSV) 146. By using the TSV instead of using a conventional connection method (e.g. the wire bonding), the degree of integration of the driver IC 140 may increase as additional spaces may not be required to bond the first surface 142 to the second surface 144, and signals may be transferred in high speeds as a connection distance may be shortened. The number of surfaces of the driver IC 140 available to be used may increase as the first surface 142 and the second surface 144 of the driver IC 140 are connected to each other through at least one TSV 146.

In some example embodiments, the driver IC 140 may include a plurality of output bumps 150 on the first surface 142. The driver IC 140 may be electrically connected to the display panel 120 through the output bumps 150. The output signals may be transferred from the driver IC 140 to the pixels 115 of the display panel 120 through the output bumps 150.

In some example embodiments, the output bumps 150 may be disposed (e.g., uniformly disposed or arranged) on the first surface 142 (e.g., the entire first surface 142) of the driver IC 140. For example, when the first surface 142 of the driver IC 140 may have a substantially rectangular shape, the output bumps 150 may be arranged in a double line along a pair of long sides of the first surface 142, or may be arranged near four sides of the first surface 142. The distance between adjacent output bumps 150 may be the same or substantially the same. For example, the distance between adjacent output bumps 150 in a first direction may be the same or substantially the same, and the distance between adjacent output bumps 150 in a second direction, which is perpendicular to the first direction, may be the same or substantially the same. The number of the output signals transferred from the driver IC 140 to the display panel 120 may increase as the output bumps 150 are disposed (e.g., uniformly disposed or arranged) on the first surface 142 (e.g., the entire first surface 142) of the driver IC 140.

In some embodiments, the driver IC 140 may include a plurality of input bumps 152 disposed on the second surface 144. The driver IC 140 may be electrically connected to the connecting structure 160 through the input bumps 152. The input signals may be transferred from the connecting structure 160 to the driver IC 140 through the input bumps 152.

The output bumps 150 and the input bumps 152 of the driver IC 140 may be formed by a conducting substance, such as metal, conducting resin, metal-resin composite material, and/or the like. For example, the metal may include gold (Au), lead (Pb), copper (Cu), etc.

In some example embodiments, the connecting structure 160 may include a base film 170, a conducting pattern 171, and an insulating layer 172. The connecting structure 160 may transfer signals from the external device 180 to the driver IC 140.

The base film 170 may include insulating material. For example, the base film 170 may be a polyimide film. The conducting pattern 171 may be on a surface (e.g., a bottom surface) of the base film 170. For example, the conducting pattern 171 may be formed on the bottom surface of the base film 170 by plating gold (Au) on a copper (Cu) pattern. The conducting pattern 171 may be utilized as wires to transfer input and output signals to drive the display device 100.

The insulating layer 172 may be on the conducting pattern 171. The insulating layer 172 may prevent or substantially prevent exposing the conducting pattern 171 to the outside. Therefore, the insulating layer 172 may cover (e.g., entirely cover) the conducting pattern 171 (e.g., a surface of the conducting pattern 171), with the exception of some portions (e.g., parts) of the conducting pattern 171 that may be connected to the driver IC 140 and/or the external device 180. For example, a solder resist may be used as the insulating layer 172.

The driver IC 140 and the connecting structure 160 may be electrically connected to each other via the input bumps 152 on the second surface 144 of the driver IC 140 contacting the conducting pattern 171 at the first side portion 162 of the connecting structure 160. In some example embodiments, a sealing member 190 may be provided to stabilize a connection between the connecting structure 160 and the driver IC 140. The sealing member 190 may surround or substantially surround the first side portion 162 of the connecting structure 160 and the second surface 144 of the driver IC 140. For example, the sealing member 190 may include epoxy resin or the like.

In some example embodiments, a transfer rate of the input signals may increase as the input signals are transferred (e.g., directly transferred) from the external device 180 to the driver IC 140 through the connecting structure 160. The number of the input and output signals may increase because both surfaces of the driver IC 140 are available to be used. Therefore, an increased demand for the input and output signals from a high resolution display device may be met, and the display device 100 may be driven at high speeds.

Figure 4:
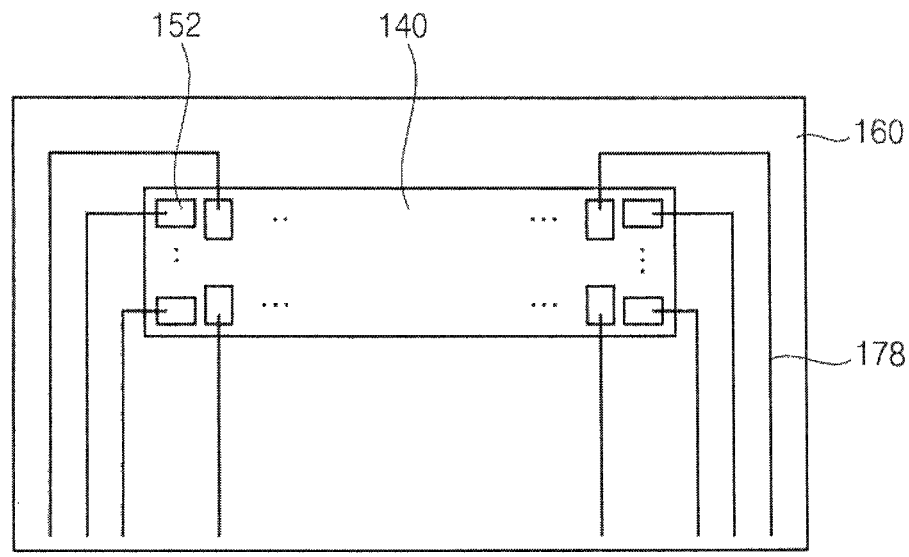
FIG. 4 is a plan view illustrating a display device in accordance with example embodiments.

FIG. 4 is a plan view illustrating a display device in accordance with example embodiments.

Referring to FIG. 4, the driver IC 140 may include the plurality of input bumps 152. The connecting structure 160 may be on the second surface 144 of the driver IC 140. The input bumps 152 may be electrically connected to connecting wires 178 of the connecting structure 160.

The input bumps 152 may be disposed (e.g., uniformly disposed or arranged) on the second surface 144 (e.g., the entire second surface 144) of the driver IC 140. For example, when the second surface 144 of the driver IC 140 has a substantially rectangular shape, the input bumps 152 may be arranged in a double line along a pair of long sides of the second surface 144, or may be disposed near four sides of the second surface 144. The distance between adjacent input bumps 152 may be the same or substantially the same. For example, the distance between adjacent input bumps 152 in a first direction may be the same or substantially the same, and the distance between adjacent input bumps 152 in a second direction, which is perpendicular to the first direction, may be the same or substantially the same. The number of the input signals transferred from the connecting structure 160 to the driver IC 140 may increase due to the input bumps 152 being disposed (e.g., uniformly disposed or arranged) on the second surface 144 (e.g., the entire second surface 144) of the driver IC 140.

Figure 5:
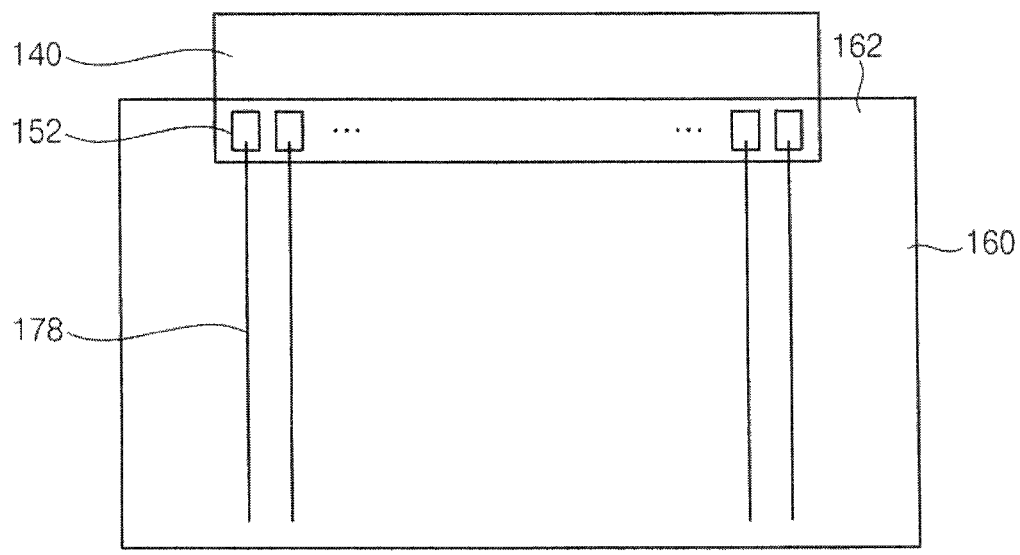
FIG. 5 is a plan view illustrating a display device in accordance with example embodiments.

FIG. 5 is a plan view illustrating a display device in accordance with example embodiments.

Referring to FIG. 5, the driver IC 140 may include the plurality of input bumps 152. The connecting structure 160 may be disposed on the second surface 144 of the driver IC 140. The input bumps 152 may be electrically connected to the connecting wires 178 of the connecting structure 160.

In some example embodiments, the first side portion 162 of the connecting structure 160 may partially cover the second surface 144 of the driver IC 140. For example, the connecting structure 160 may substantially cover half of the second surface 144 of the driver IC 140. Accordingly, heat may be transferred (e.g., easily transferred) from the driver IC 140 in a bonding process, as some portion or part of the driver IC 140 may be exposed.

Figure 6:
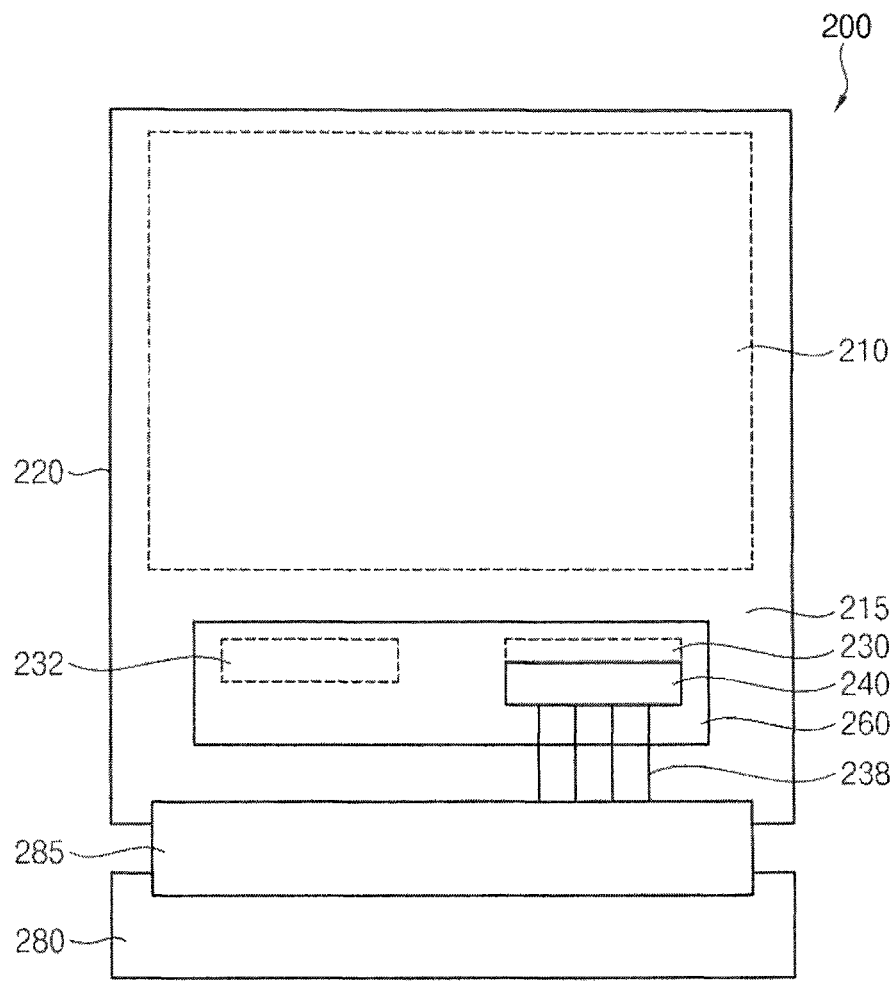
FIG. 6 is a plan view illustrating a display device in accordance with example embodiments.
Figure 7:
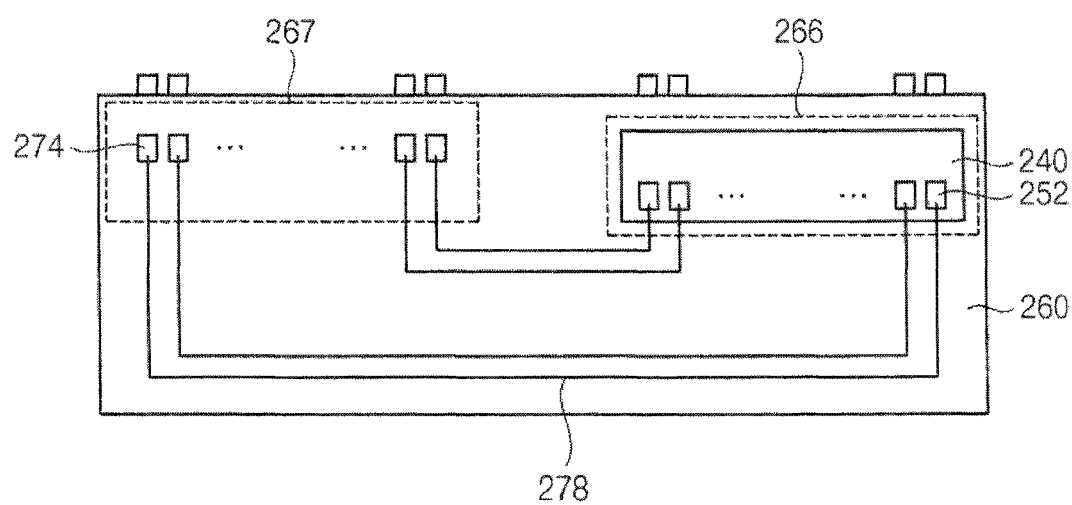
FIG. 7 is a plan view illustrating a display device in accordance with example embodiments.
Figure 8:
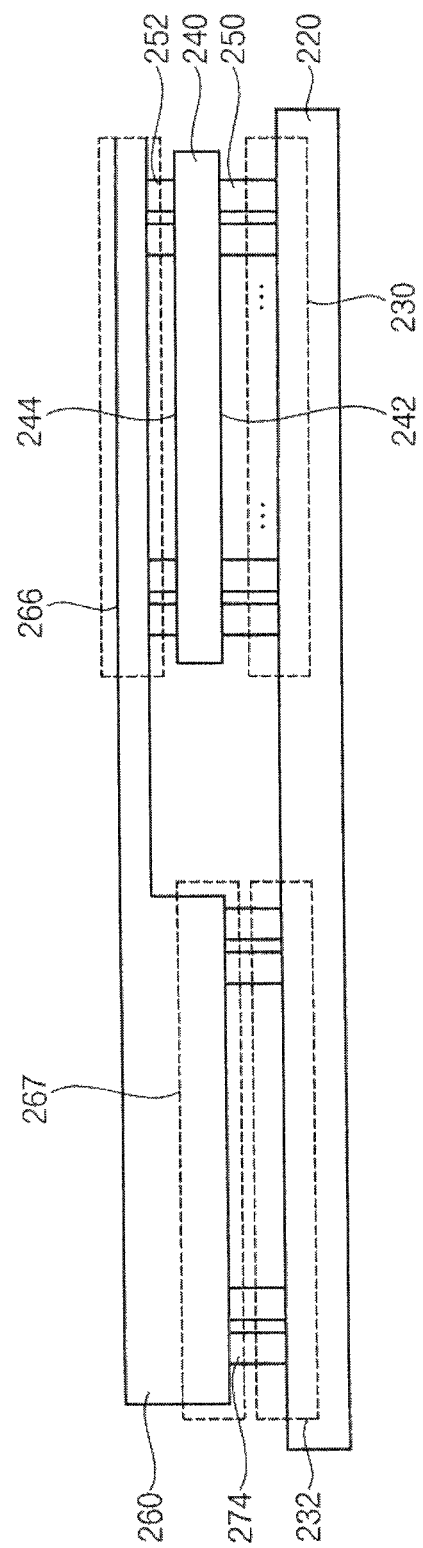
FIG. 8 is a cross-sectional view illustrating a display device in accordance with example embodiments.

FIG. 6 is a plan view illustrating a display device in accordance with example embodiments, FIG. 7 is a plan view illustrating a display device in accordance with example embodiments, and FIG. 8 is a cross-sectional view illustrating a display device in accordance with example embodiments.

Referring to FIGS. 6 to 8, the display device 200 may include a display panel 220, a driver IC 240, and a connecting structure 260. An external device 280 may be connected to the display device 200.

The display panel 220 may include a display area 210 on which a plurality of pixels is disposed, and may include a peripheral area 215 to which the driver IC 240 may be electrically connected. The display panel 220 may include a first pad part 230, a second pad part 232, and lines 238 located at the peripheral area 215. The first pad part 230 may transfer output signals from the driver IC 240 to the pixels of the display area 210, and the second pad part 232 may transfer output signals from the connecting structure 260 to the pixels of the display area 210. The lines 238 may transfer input signals from the external device 280 to the driver IC 240.

As illustrated in FIG. 6, the second pad part 232 may be on a left side of the first pad part 230, although the locations of the first pad part 230 and the second pad part 232 may be altered (e.g., switched). For example, the second pad part 232 may be on a right side of the first pad part 230. When the second pad part 232 is on the left side or the right side of the first pad part 230, a space for output lines on the display panel 220, which transfer the output signals to the display area 210, may decrease, and a dead space of the display panel 220 may decrease.

The driver IC 240 may receive the input signals from the external device 280, and may transfer the output signals to the pixels on the display area 210 of the display panel 220. For example, the input signals of the output signals may include a power voltage signal, an initialization voltage signal, a data voltage signal, and/or a scan voltage signal.

In some example embodiments, a first surface 242 and a second surface 244 of the driver IC 240 may be electrically connected to each other. In some embodiments, the first surface 242 may be a bottom surface of the driver IC 240, and the second surface 244 may be a top surface of the driver IC 240. For example, the first surface 242 and the second surface 244 of the driver IC 240 may be connected to each other in a direct manner (e.g. by a wire bonding or by a flip-chip bonding), or in an indirect manner (e.g. a manner using the electric field or the magnetic field). The number of surfaces of the driver IC 240 to be used for a connection between the display panel 220 and the external device 280 may increase, and the number of the input and output signals may increase as the first surface 242 and the second surface 244 of the driver IC 240 are electrically connected to each other.

The first surface 242 of the driver IC 240 may be electrically connected to the first pad part 230 of the display panel 220. For example, the driver IC 240 may be electrically connected to the display panel 220 by the COG manner. In some example embodiments, first output bumps 250 may be on the first surface 242 of the driver IC 240, and the first surface 242 of the driver IC 240 may be electrically connected to pads of the first pad part 230.

The connecting structure 260 may transfer the output signals from the driver IC 240 to the second pad part 232 of the display panel 220.

A first area 266 of the connecting structure 260 may be electrically connected to the second surface 244 of the driver IC 240. For example, the first area 266 may be arranged on a right side (e.g., right portion or area) of the connecting structure 260 as illustrated in FIG. 8, although the inventive concept is not limited thereto. In some example embodiments, second output bumps 252 may be arranged on the second surface 244 of the driver IC 240, and the second surface 244 of the driver IC 240 may be electrically connected to the first area 266 of the connecting structure 260.

A second area 267 of the connecting structure 260 may be electrically connected to the second pad part 232 of the display panel 220. For example, the second area 267 may be arranged on a left side (e.g., left portion or area) of the connecting structure 260 as illustrated in FIG. 8, although the inventive concept is not limited thereto. In some example embodiments, connecting bumps 274 may be arranged on the second area 267 of the connecting structure 260, and the second area 267 of the connecting structure 260 may be electrically connected to pads of the second pad part 232.

The connecting wires 278 of the connecting structure 260 may connect the second output bumps 252 to the connecting bumps 274. Therefore, the output signals transferred from the driver IC 240 may be transferred to the pixels of the display area 210 of the display panel 220 through the second pad part 232, and the display device 200 may thereby be driven.

The external device 280 may transfer the input signals to the driver IC 240 through the lines 238 on the display panel 220. In some embodiments, the external device 280 may include a timing controller to control the input signals transferred to the driver IC 240. The external device 280 may be electrically connected to the display panel 220. For example, the external device 280 may be connected to the display panel 220 through a flexible printed circuit 285, or may be directly connected to the display panel 220.

According to some example embodiments, the number of the output signals may increase due to both surfaces of the driver IC 240 being available to be used. The number of pad parts electrically connected to the driver IC 240 to transfer the output signals may increase by using the connecting structure 260. Therefore, an increased demand for the output signals from a high resolution display device may be met.

Figure 9:
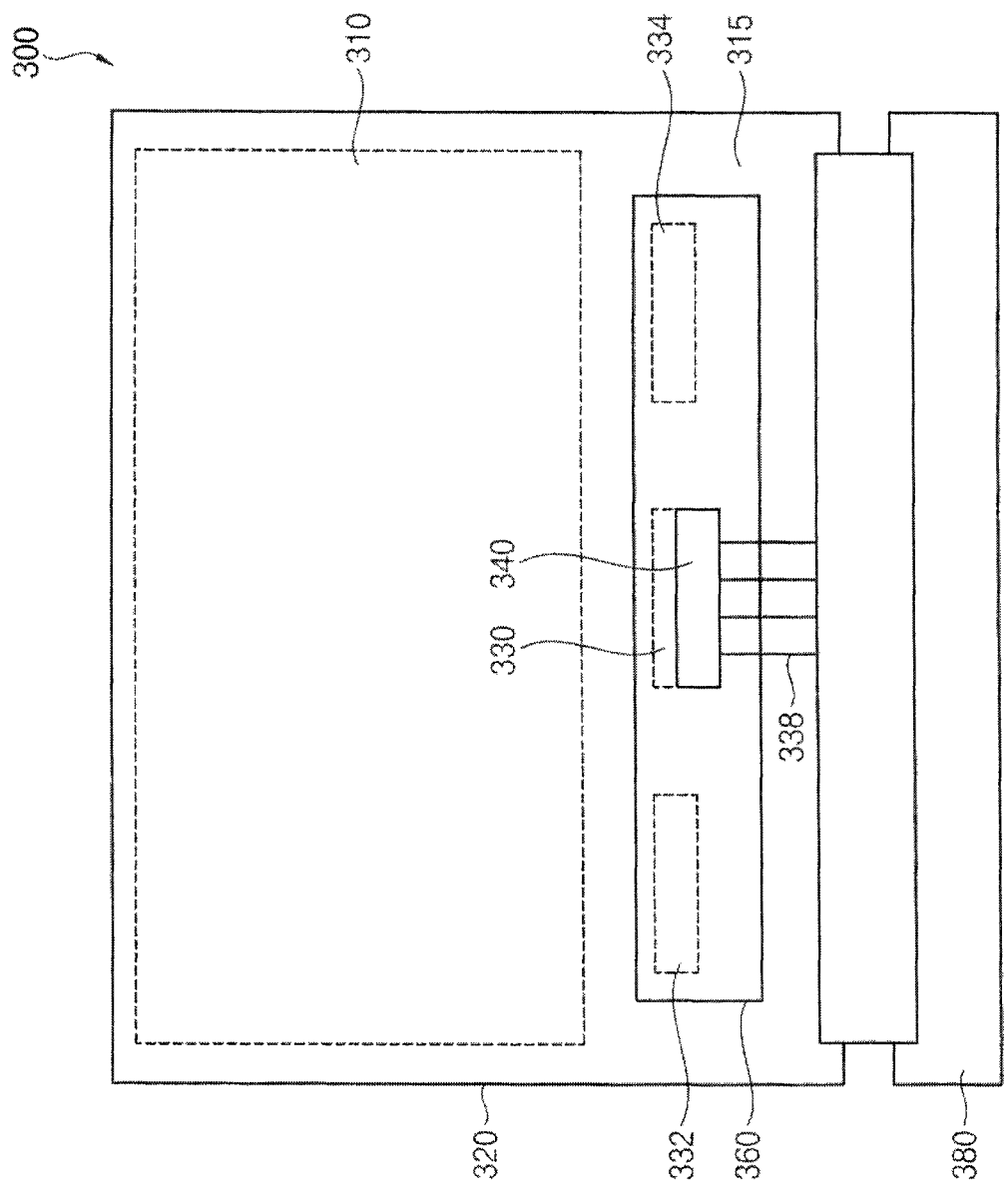
FIG. 9 is a plan view illustrating a display device in accordance with example embodiments.
Figure 10:
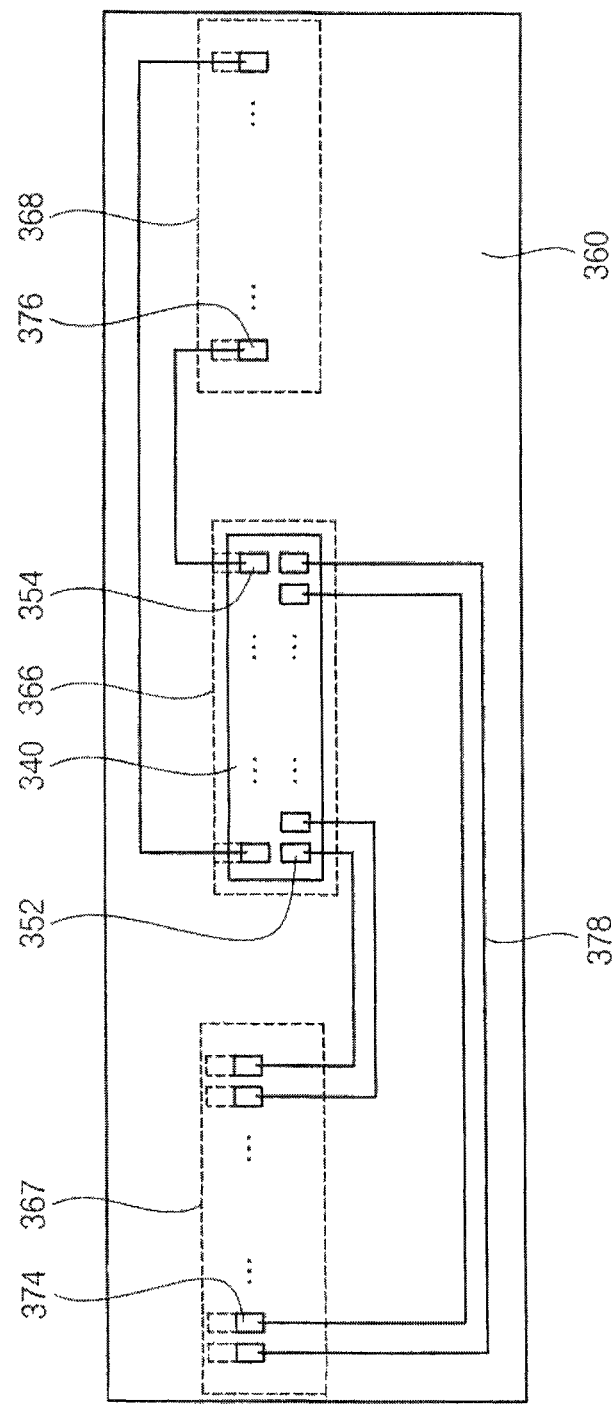
FIG. 10 is a plan view illustrating a display device in accordance with example embodiments.

FIG. 9 is a plan view illustrating a display device in accordance with example embodiments, and FIG. 10 is a plan view illustrating a display device in accordance with example embodiments.

Referring to FIGS. 9 and 10, the display device 300 may include a display panel 320, a driver IC 340, and a connecting structure 360, similar to those described with reference to FIGS. 6 to 8. An external device 380 may be electrically connected to the display device 300.

The display panel 320 may include a display area 310 on which a plurality of pixels is disposed, and may include a peripheral area 315 to which the driver IC 340 may be electrically connected. The display panel 320 may include a first pad part 330, a second pad part 332, a third pad part 334, and lines 338 at the peripheral area 315. The first pad part 330 may transfer output signals from the driver IC 340 to the pixels of the display area 310, and the second pad part 332 and the third pad part 334 may transfer output signals from the connecting structure 360 to the pixels of the display area 310.

As illustrated in FIG. 9, the second pad part 332 may be arranged at a left side of the first pad part 330, and the third pad part 334 may be arranged at a right side of the first pad part 330, although locations of the first pad part 330, the second pad part 332, and the third pad part 334 may be altered. For example, the second pad part 332 may be arranged at the right side of the first pad part 330, and the third pad part 334 may be arranged at the left side of the first pad part 330. When the first pad part 330, the second pad part 332, and the third pad part 334 are arranged as described above, a space for output lines of the display panel 320, which transfer the output signals to the display area 310, may decrease, and a dead space of the display panel 320 may decrease.

The connecting structure 360 may transfer the output signals from the driver IC 340 to the second pad part 332 and the third pad part 334 of the display panel 320.

A first area 366 of the connecting structure 360 may be electrically connected to the second surface of the driver IC 340 (e.g., in a manner that is similar to the manner in which the first area 266 of the connecting structure 260 may be electrically connected to the second surface 244 of the driver IC 240 as shown in the embodiment of FIG. 8). For example, the first area 366 may be arranged at or near the center of the connecting structure 360 as illustrated in FIG. 10, although the inventive concept is not limited thereto. In some example embodiments, second output bumps 352 and third output bumps 354 may be arranged on the second surface of the driver IC 340, and the second surface of the driver IC 340 may be electrically connected to the first area 366 of the connecting structure 360.

A second area 367 of the connecting structure 360 may be electrically connected to the second pad part 332 of the display panel 320. For example, the second area 367 may be arranged at a left side of the connecting structure 360 as illustrated in FIG. 10, although the inventive concept is not limited thereto. In some example embodiments, first connecting bumps 374 may be arranged on the second area 367 of the connecting structure 360, and the second area 367 of the connecting structure 360 may be electrically connected to pads of the second pad part 332.

A third area 368 of the connecting structure 360 may be electrically connected to the third pad part 334 of the display panel 320. For example, the third area 368 may be arranged at a right side of the connecting structure 360 as illustrated in FIG. 10, although the inventive concept is not limited thereto. In some example embodiments, second connecting bumps 376 may be arranged on the third area 368 of the connecting structure 360, and the third area 368 of the connecting structure 360 may be electrically connected to pads of the third pad part 334.

The connecting wires 378 of the connecting structure 360 may connect the second output bumps 352 to the first connecting bumps 374, and may connect the third output bumps 354 to the second connecting bumps 376. Therefore, the output signals transferred from the driver IC 340 may be transferred to the pixels of the display area 310 of the display panel 320 through the second pad part 332 and the third pad part 334, and the display device 300 may be driven.

Although some example embodiments of the display devices have been described with reference to the figures, those skilled in the art will readily appreciate that various modifications are possible in the example embodiments without departing from the spirit and scope of the present inventive concept.

The present inventive concept may be applied to any electronic device including a display device. For example, the present inventive concept may be applied to display devices for computers, notebooks, cellular phones, smart phones, smart pads, portable media players (PMPs), personal digital assistances (PDAs), MP3 players, digital cameras, video camcorders, etc.

The foregoing is illustrative of example embodiments and is not to be construed as limiting thereof. Although some example embodiments have been described, those skilled in the art will readily appreciate that various modifications are possible in the example embodiments without departing from the spirit and scope of the present inventive concept. Accordingly, all such modifications are intended to be included within the scope of the present inventive concept as defined in the claims, and their equivalents. Therefore, it is to be understood that the foregoing is illustrative of various example embodiments and is not to be construed as limited to the specific example embodiments disclosed, and that modifications to the disclosed example embodiments, as well as other example embodiments, are intended to be included within the spirit and scope of the appended claims, and their equivalents.

What is claimed is:

1. A display device, comprising:
a display panel;
a driver integrated circuit (IC) comprising:
   a first surface electrically connected to the display panel;
   a second surface opposing the first surface and electrically connected to the first surface; and
   input bumps directly on the second surface; and
a connecting structure comprising:
   a first side portion electrically connected to the second surface of the driver IC, the first side portion comprising a conducting pattern directly on the input bumps; and
   a second side portion electrically connected to an external device,
wherein the display panel, the driver IC, and the connecting structure are stacked in the stated order.

2. A display device, comprising:
a display panel;
a driver integrated circuit (IC) comprising:
   a first surface electrically connected to the display panel;
   a second surface opposing the first surface and electrically connected to the first surface; and
   input bumps directly on the second surface; and
a connecting structure comprising:
   a first side portion electrically connected to the second surface of the driver IC, the first side portion comprising a conducting pattern directly on the input bumps; and
   a second side portion electrically connected to an external device,
wherein the driver IC is on the display panel and the connecting structure is on the driver IC, and
wherein the first surface and the second surface are electrically connected to each other through at least one through-silicon-via.

3. The display device of claim 1, wherein the connecting structure comprises:
a base film, wherein the conducting pattern is on a surface of the base film; and
an insulating layer on the conducting pattern.

4. The display device of claim 1, wherein the driver IC further comprises:
output bumps on the first surface.

5. The display device of claim 4, wherein the output bumps are uniformly arranged on an entirety of the first surface.

6. The display device of claim 4, wherein the input bumps are uniformly arranged on an entirety of the second surface.

7. The display device of claim 4, wherein the input bumps and the output bumps comprise gold (Au), lead (Pb), copper (Cu), a conductive resin, or a metal-resin composite material.

8. The display device of claim 1, wherein the first side portion of the connecting structure entirely covers the second surface of the driver IC.

9. The display device of claim 1, wherein the first side portion of the connecting structure partially covers the second surface of the driver IC.

10. The display device of claim 1, wherein the driver IC comprises a data driver IC and/or a scan driver IC.

11. The display device of claim 1, wherein the display device further comprises a sealing member surrounding the first side portion of the connecting structure and the second surface of the driver IC.

\* \* \* \* \*